United States Patent [19]

Dishon et al.

[11] Patent Number: 4,921,157

[45] Date of Patent: May 1, 1990

[54] FLUXLESS SOLDERING PROCESS

[75] Inventors: Giora Dishon, Jerusalem, Israel; Stephen M. Bobbio, Wake Forest, N.C.

[73] Assignee: Microelectronics Center of North Carolina, Research Triangle Park, N.C.

[21] Appl. No.: 324,247

[22] Filed: Mar. 15, 1989

[51] Int. Cl.[5] .......................... B23K 1/20; B23K 35/38
[52] U.S. Cl. .................................. 228/124; 228/180.2; 228/220; 228/221; 204/170
[58] Field of Search ...................... 228/124, 180.2, 205, 228/206, 207, 218, 219, 220, 42; 204/170; 134/2

[56] References Cited

U.S. PATENT DOCUMENTS

| 4,081,121 | 3/1978 | Picard | 228/220 |
| 4,405,379 | 9/1983 | Chasteen | 228/220 |
| 4,498,046 | 2/1985 | Faris et al. | 324/158 |
| 4,504,007 | 3/1985 | Anderson, Jr. et al. | 228/123 |
| 4,577,398 | 3/1986 | Sliwa et al. | 29/590 |

FOREIGN PATENT DOCUMENTS

| 0034041 | 8/1981 | European Pat. Off. | 228/220 |
| 3442538 | 7/1985 | Fed. Rep. of Germany | 228/124 |

OTHER PUBLICATIONS

Genieys, E., British Association for Brazing and Soldering, "Brazing in Reducing Fluoride Containing Atmospheres", London, Nov. 1972.
IBM Technical Disclosure Bulletin, vol. 27, No. 11, Apr. 1985—"Dry Soldering Process Using Halogenated Gas".
Moskowitz and Yeh, "Thermal Dry Process Soldering", J. Vac. Sci. Technol. A, vol. 4, No. 3, May/Jun. 1986.
Moskowitz and Davidson, "Summary Abstract: Laser—Assisted Dry Process Soldering", J. Vac. Sci. Technol. A., vol. 3, No. 3, May/Jun. 1985.

Primary Examiner—Nicholas P. Godici
Assistant Examiner—Samuel M. Heinrich
Attorney, Agent, or Firm—Bell, Seltzer, Park & Gibson

[57] ABSTRACT

A method of soldering without the need for fluxing agents, high temperature, hydrogen, laser excitation or sputtering techniques. The method uses plasma excitation to remove surface oxides from solder surfaces, thereby eliminating the need for post-soldering cleaning in an accurate and efficient manner, resulting in a higher quality and long term reliability solder joint. In addition, serious environmental problems caused by cleaning solvents are avoided.

43 Claims, 2 Drawing Sheets

FLUXLESS SOLDERING PROCESS

FIELD OF THE INVENTION

The present invention relates to a method for soldering, and more particularly to a fluxless soldering method which eliminates the need for post-soldering cleaning.

BACKGROUND OF THE INVENTION

In the area of electronic circuit fabrication, it is necessary to bring discrete devices into electrical contact. For example, integrated circuits (or "chips") are often mounted on printed wiring boards, or other such devices, which may be generally referred to as substrates. The contact between the chip and substrate must have physical, chemical and electrical integrity and stability.

One method for physically and electrically connecting microelectronic devices employs the fabrication of metal pads on the top or exposed surface of various substrates. These metal pads are often formed with a top layer of solder; i.e., a low melting point alloy, usually of the lead-tin type, used for joining metals at temperatures around 450° F. The solder pads are brought into contact with a metal structural element often referred to as a "metallurgy"—typically a metal pad—that will wet with liquid solder when heat is applied to join the solder and the metal pad and thereby form the electrical connection.

At present, most soldering processes comprise three basic steps: (1) pre-cleaning and deoxidation of surface oxides; (2) solder reflow and/or reflow joining; and (3) post-soldering cleaning. The pre-cleaning step is performed with different flux materials to prepare the surfaces for the soldering step by removal of contaminants and metal oxides from the solder surface. The solder joining step can occur only after the oxide coating is removed because the high melting point oxides will prevent the wetting of the two surfaces to be joined by reflow of the solder. Solder reflows into its characteristic spherical shape when heated, and joins the surfaces in contact with the solder. The third step, post-soldering cleaning, removes any flux residue remaining from the first step.

The post-soldering step has become more difficult to perform effectively as the size of electronic components shrink, making it much more difficult for the post-soldering cleaning agents to penetrate the smaller gaps between the components and the substrate. The post-soldering step becomes even more difficult when Surface Mount Technology (SMT) is employed.

Inefficient fluxing will result in defective bonding and inefficient post-soldering cleaning will reduce the long term reliability of the whole assembly. A high investment in cleaning equipment, materials, and processes can solve some of the problems, but undesired effects on the environment caused by cleaning solvents are generated.

A dry or fluxless soldering process can replace the pre-cleaning step and totally eliminate the post-soldering cleaning step. Since the main reason for using flux while reflowing solder joints is to break the high melting point and rigid oxide that covers the solder, a gas phase reaction that will remove this layer can replace the commonly used liquid fluxes that necessitate the post-soldering cleaning step.

Various attempts at fluxless soldering have been made; however, these attempts have suffered from limitations that made them applicable only to a small number and very specific applications.

For example, Moskowitz and Yeh in "Thermal Dry Process Soldering," J.VAC.SCI.TECHNOL.A. Vol. 4, No. 3, May/June 1986, describe a dry soldering process for solder reflow and bonding of Pb/Sn solder. This process uses halogen containing gases, $CF_2$, $CL_2$, $CF_4$, and $SF_6$ for the reduction of the surface oxide to enable solder reflow at temperature above the solder melting point. The activation energy needed for the oxide reduction by these gases is lowered by the use of a catalyst (Pt mesh) in a vacuum chamber. Yet the temperature needed for successful reflow bonding is 350° C. This temperature is well above the typical soldering temperature for most electronic applications, i.e., 220° C., and can damage the components, the substrate, and generate defects due to thermal mismatch between different materials.

Another attempt at fluxless soldering is disclosed in IBM Technical Disclosure Bulletin Vol. 27, No. 11, April, 1985, entitled, "Dry Soldering Process Using Halogenated Gas." The IBM bulletin discloses the use of halogenated gases in an inert carrier gas at elevated temperature to produce a reduction of solder oxide by the reactive gas and to allow solder reflow. Again, for the more common low temperature applications, thermal damage may result. Moskowitz and Davidson in "Summary Abstract: Laser-Assisted Dry Process Soldering," J. VAC.SCI.TECHNOL.A., Vol. 3, No. 3, May/June, 1985, describe a laser-assisted fluxless soldering technique for solder reflow. This technique uses laser radiation to excite an otherwise non-reactive gas in the presence of pre-heated solder surface. This technique requires direct access of the laser radiation to the solder surface, thus limiting the applications as well as resulting in a low throughput process.

Other attempts to remove surface oxides have employed sputtering. The sputtering methods, however, are extremely inaccurate and can damage the substrates and components while removing oxides, and are very limited in penetration distances, making sputtering unsuitable to applications like solder reflow.

In summary, the use of high temperatures in the available fluxless soldering methods may often have deleterious effects on the printed circuit boards and the components being joined. Laser assisted soldering methods have also proven inadequate for commercial use, because laser beams do not penetrate to unexposed areas, and thus cannot be applied to solder joining. In addition, being based on a localized beam, it is a time consuming process.

SUMMARY OF THE INVENTION

It is therefore an object of the present invention to provide an improved soldering process.

It is another object of the present invention to provide an improved fluxless soldering process.

It is yet another object of the present invention to provide a soldering process without the need for the post-soldering cleaning step.

It is yet another object of the present invention to provide a pre-soldering process for improved solder reflow.

It is yet another object of the present invention to provide an improved fluxless soldering reflow process without the need for laser or thermal excitation.

It is yet another object of the present invention to provide an improved fluxless soldering process which occurs at a low temperature.

It is still another object of the present invention to provide an improved removal of surface compounds such as oxides from the solder surface.

These and other objects of the present invention are accomplished by supplying the activation energy for the removal of the solder surface oxides through a plasma process. For example, in a plasma treatment using fluorinated gases (e.g., $SF_6$, $CF_4$, or other fluorinated gases), the tin oxide may be converted to tin fluoride. It has been found that tin fluoride does not prevent the wetting of the two surfaces to be joined during the solder reflow step as does tin oxide.

One or more surfaces to be joined by the solder can be coated with solder to aid in the wetting of the solder. The solder is then treated with a plasma-assisted reaction to form the tin fluoride, which may be stored and reflowed later in an inert atmosphere or vacuum. This method has the advantages of improved wetting of the surfaces to the solder without the need for a fluxing agent during the solder reflow, and/or reflow joining step.

According to the present invention, converting the tin oxide to tin fluoride through a plasma process occurs at a low temperature. Typically, the temperature is about 34° C. to 50° C. The plasma treatment time is short (i.e., approximately ½-3 minutes) and can occur at low or high pressures (i.e., 5 m Torr to 1 Torr). The solder reflow occurs in a non-oxidizing atmosphere. Preferably, the plasma treatment and reflow and/or reflow joining occur in an unbroken vacuum, to encourage the formation of higher quality solder wetting. A high throughput, reliable soldering process is thus provided, which does not damage the chip or substrate to be soldered.

DESCRIPTION OF THE DRAWINGS

Other objects and advantages of the invention and the manner in which same are accomplished will be more completely understood with reference to the detailed description and to the drawings in which.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set forth herein; rather, applicants provide this embodiment so that this disclosure will be thorough and complete, and will fully convey the scope of the invention to those skilled in the art.

Like characters refer to like elements throughout. For greater clarity, the thickness of layers has been exaggerated.

FIGS. 1A-E and 2A-E show a fluxless plasma pretreatment and reflow joining of the present invention. FIGS. 3A-E and 4A-E show a fluxless plasma pretreatment and solder reflow of the present invention. Similar numbers represent similar elements.

Figure 1A:
FIGS. 1A-E show a fluxless plasma pretreatment and solder reflow joining method of the invention.

Referring now to both FIGS. 1 and 3, in FIG. 1A, the first surface 10 to be soldered is shown. Surface 10 may be a substrate, for example, a printed circuit, SMT board, or surface 10 maybe another solder bump.

Figure 1B:
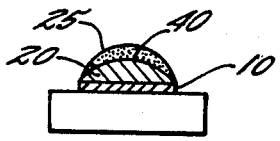

Referring now to FIG. 1B, solder 20 is deposited on the first surface 10. The solder 20 can be of any appropriate soldering material such as tin, lead tin, and lead-tin based alloys. Applicants used the eutectic 63% lead, 37% tin material (melting point 183° C.). Surface oxides 25 form on the exposed portion 40 of the solder 20 through exposure to oxygen in the ambient. The presence of surface oxides prevents the solder reflow or the wetting of the surfaces to be solder joined and must therefore be removed.

Figure 1C:
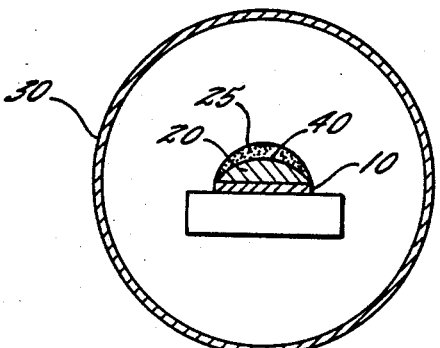

Referring now to FIG. 1C, the first surface 10 and solder 20 with surface oxides 25 are placed in a reaction chamber 30. Within the vacuum of the reaction chamber, the plasma solder treatment process is performed. The plasma excitation is of a fluorinated gas (i.e., $SF_6$, $CF_4$). The plasma treatment may occur at room temperature (34°-50° C.). The plasma process is preferably very short in duration (i.e., ½-3 minutes). The treatment may occur in relatively high pressure (for example, 1 Torr) or low pressure (for example, 5 m Torr). Power level, gas flow, gas mixture and other typical plasma process conditions may vary according to the reactor configuration and the nature of the assembly to be treated.

Surface oxides prevent wetting of the surfaces to be soldered and must therefore be removed. Applicants believe that fluorinated gases will remove the surface oxides during the plasma process because of the higher electronegativity of fluorine or due to instability in the fluorine structure.

While applicants do not wish to be bound to a particular theory, it is believed that the activation energy needed for converting the oxides is supplied by excited fluorine radicals in the plasma which diffuse and hit the surface oxide 25, resulting in formation of a fluorine compound 45 on the solder surface. The fluorine plasma process is performed until the surface oxide 25 is substantially removed from the solder surface and a compound of the solder material 20 and fluorine forms on the solder surface.

Figure 1D:
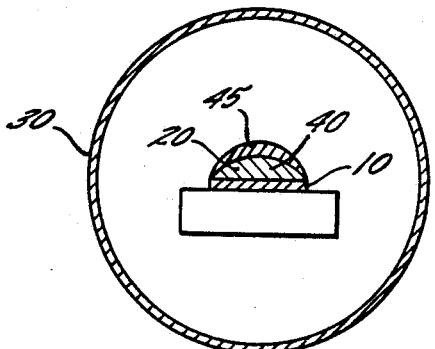

Referring to FIG. 1D, the compound 45 formed during the plasma process is shown on the exposed surface 40 of solder bump 20. The plasma is a fluorinated gas (for example, $SF_6$ or $CF_4$), resulting in a tin fluoride compound 45. FIG. 1D illustrates the removal of the surface oxide layer 25 from the surface and the formation of a tin fluoride compound on the solder surface.

Figure 1E:
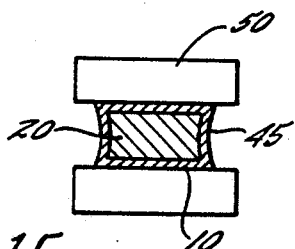

Referring now to FIG. 1E, in the first embodiment of the method of the present invention, the substrate and solder are removed from the plasma pretreatment reaction chamber 30. The solder is then reflowed in a non-oxidizing ambient to form either a solder bump 60 or to reflow and join the second 50 surfaces. Second surface 50 may be a component or another solder bump. The reflow or reflow joining conditions are the same typical conditions used with conventional wet flux methods. While applicants do not wish to be bound to a particular theory, it is believed that during reflow, the surface fluoride in the compound 45 either dissolves into the solder 20 or breaks up into colloidal-type particles. FIGS. 3A-E illustrate the same process except no joining of the solder to another object occurs; only solder reflow occurs.

Figure 2A:
FIGS. 2A-E show another fluxless plasma reflow joining method of the present invention.
Figure 2B:
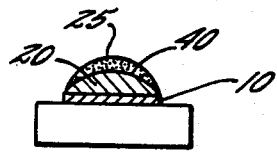

Referring now to FIGS. 2A-E and 4A-E, a preferred embodiment of the present invention is shown. In this embodiment, reflow or reflow joining of the solder occurs in the vacuum of the reaction chamber 30 in a continuous mode with the plasma treatment, thereby creating a higher quality joint since exposure to the ambient is prevented. In FIG. 2A, a first substrate 10 is shown. As in FIG. 1B, FIG. 2B shows a first surface 10 having a solder 20 deposited thereon. Surface oxides 25 form on the exposed surface 40 of the solder 20. The oxides 25 prevent the solder reflow or the wetting by the solder of the two surfaces to be joined.

Figure 2C:
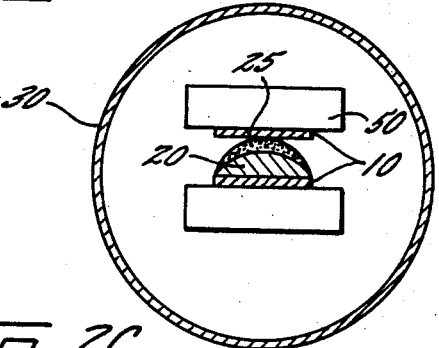

Referring now to FIG. 2C, the structure of FIG. 2B is placed within a reaction chamber 30 whereupon the same plasma process as described in connection with FIG. 1C is performed.

Figure 2D:
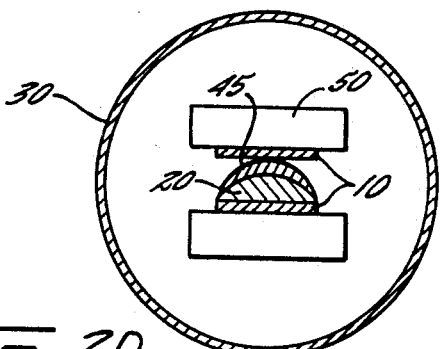

Referring now to FIG. 2D, the post-plasma treatment structure devoid of surface oxides is shown. Solder bump 20 now has a surface compound 45 consisting of solder and fluorine in such quantities sufficient to allow solder reflow or wetting of the solder bump 20 to a second surface to occur.

Figure 2E:
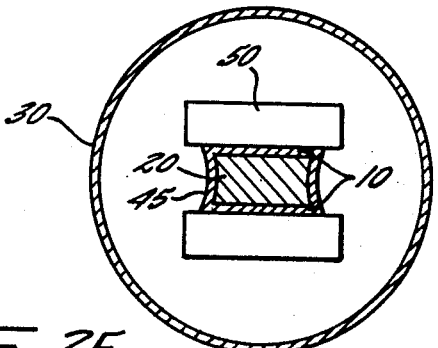
Figure 3A:
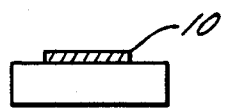
FIGS. 3A-E show a fluxless plasma pretreatment and solder reflow method of the invention.
Figure 3B:
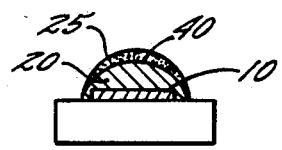
Figure 3C:
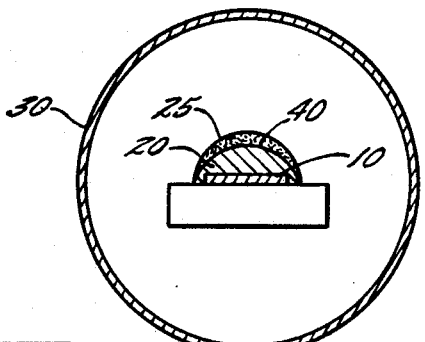
Figure 3D:
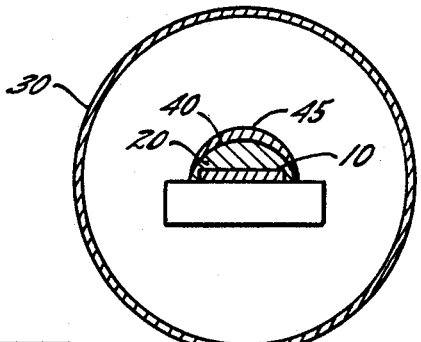
Figure 3E:
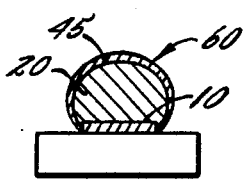
Figure 4A:
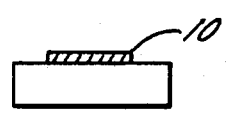
FIGS. 4A-E show another fluxless plasma reflow method of the invention.
Figure 4B:
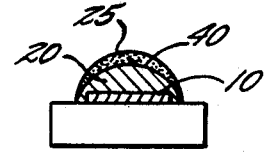
Figure 4C:
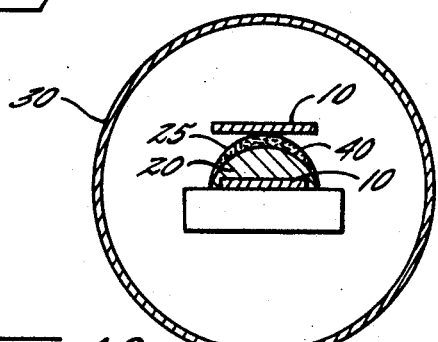
Figure 4D:
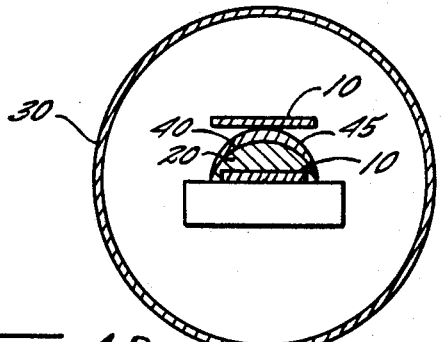
Figure 4E:
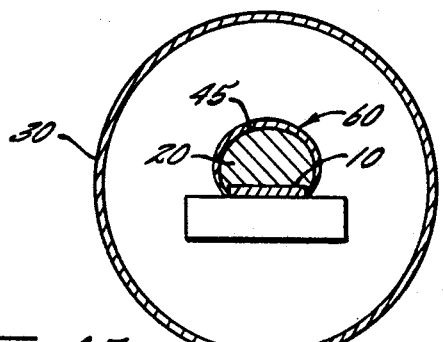

Referring now to FIG. 2E, in the continuous mode of operation, the solder bump 20 on the first surface 10 is reflowed or reflow joined to surface 50. The performance of the plasma treatment and reflow in a continuous mode within the reaction chamber creates a much higher quality solder surface because risk of reoxidation is eliminated by not exposing the solder surface to the ambient. FIGS. 4A-E illustrate the same process, except no joining of the solder to another object occurs; only solder reflow occurs.

In another alternative embodiment of this invention, the plasma process treatment and the reflow process may occur simultaneously and/or the second surface 50 may be brought in contact with the solder 20 during reflow. In yet another alternative embodiment of the invention, either or both of the surfaces 10 and 50 to be joined by the solder can be coated with a layer of the solder material or other known materials (i.e., gold) which improve the wetting of the solder to the surfaces to be joined. Both solder surfaces are then treated in a pressure-assisted reaction to form the tin fluoride and then reflowed with even higher bond integrity.

In another alternative embodiment of this invention, prior to the fluorine plasma treatment, an oxygen plasma treatment, as commonly known in the industry, can be performed. The oxygen plasma treatment will remove—by oxidation—any organic residue from the surface and eliminates any need for pre-solder cleaning. Organic residue can prevent complete removal of the surface oxides and replacement by fluorides through the fluorine plasma treatment. The oxygen plasma treatment occurs at similar conditions to the fluorine plasma treatment as described earlier. The oxygen plasma treatment may, however, occur at higher pressures. This step can replace the pre-soldering cleaning and will further improve solder reflow or wetting.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of soldering without the need for fluxing agents, comprising the steps of:
   a. depositing solder on a first surface, said solder having a surface oxide layer;
   b. performing fluorine-containing plasma excitation on said solder; and
   c. reflowing said solder on said first surface.

2. The method of claim 1 wherein said reflowing step comprises placing said solder in contact with a second surface, to thereby solder join together said first and second surfaces without the need for post-soldering cleaning.

3. The method of claim 2 wherein said placing step is preceded by the step of coating both of said first and second surfaces with solder.

4. The method of claim 1 wherein said reflowing step occurs in a vacuum.

5. The method of claim 1 wherein said performing and reflowing steps occur in a continuous vacuum.

6. The method of claim 1 wherein said performing a fluorine plasma excitation step occurs at a temperature of approximately 34°-50° C.

7. The method of claim 1 wherein said performing a fluorine plasma excitation step comprises performing said fluorine plasma excitation for approximately one-half to three minutes.

8. The method of claim 1 wherein said reflow step occurs at low pressure.

9. The method of claim 1 wherein said reflow step occurs at high pressure.

10. The method of claim 1 wherein said performing a fluorine-containing plasma excitation step comprises the use of fluorine radicals as a reactive species.

11. The method of claim 1 wherein said performing and said reflowing steps occur simultaneously.

12. The method of claim 1 wherein said reflowing step occurs at a temperature of approximately 200° C.

13. The method of claim 1 wherein said performing step converts at least some of the surface oxides to a compound of the solder and fluorine.

14. The method of claim 1 wherein said performing step is preceded by an oxygen plasma treatment.

15. A method of soldering without the need for fluxing agents, comprising the steps of:
   a. depositing a layer of solder on a first surface, said solder having a surface oxide layer;
   b. performing a fluorine-containing plasma excitation at room temperature on said solder to convert said surface oxides to a compound of solder and fluorine; and
   c. reflowing said solder on said first surface in a non-oxidizing ambient.

16. The method of claim 15 wherein said reflowing step comprises placing said solder in contact with a second surface to form a solder bond between said first and second surfaces.

17. The method of claim 15 wherein said reflowing step occurs at a temperature of approximately 200° C.

18. The method of claim 15 wherein said reflowing step occurs in a vacuum.

19. The method of claim 15 wherein said performing a fluorine-containing plasma treatment and reflowing steps occur in a continuous vacuum.

20. The method of claim 15 wherein said performing a fluorine-containing plasma excitation step comprises performing said fluorine plasma excitation for approximately one-half to three minutes.

21. The method of claim 15 wherein said reflow step occurs in a low pressure.

22. The method of claim 15 wherein said reflow step occurs at high pressure.

23. The method of claim 15 wherein said performing a fluorine-containing plasma excitation step comprises the use of fluorine radicals as a reactive species.

24. The method of claim 15 wherein said performing a fluorine-containing plasma excitation and said reflowing steps occur simultaneously.

25. The method of claim 15 wherein said performing step is preceded by an oxygen plasma treatment.

26. A method of soldering which removes surface oxides from exposed solder surfaces without the need for fluxing agents, comprising the steps of:
 a. depositing solder on a first surface to be soldered;
 b. performing a fluorine-containing plasma excitation on said solder until sufficient fluorine compound forms on the exposed surface of said solder to permit wetting to occur; and
 c. reflowing said solder on said first surface.

27. The method of claim 26 wherein said placing step comprises placing said treated solder in contact with a second surface to form a physical and electrical contact between said first and second surfaces.

28. The method of claim 26 wherein said reflowing step occurs at a temperature of approximately 200° C.

29. The method of claim 26 wherein said reflowing step occurs in a vacuum.

30. The method of claim 26 wherein said performing a plasma excitation step comprises performing said plasma excitation for approximately one-half to three minutes.

31. The method of claim 26 wherein said reflow step occurs in a low pressure.

32. The method of claim 26 wherein said reflow step occurs in a high pressure.

33. The method of claim 26 wherein said performing a plasma excitation step occurs at approximately 34°–50° C.

34. The method of claim 26 wherein said performing a plasma excitation step comprises the use of fluorine radicals as the reactive species.

35. The method of claim 26 wherein said performing a plasma excitation and said reflowing steps occur simultaneously.

36. The method of claim 29 wherein said placing step is preceded by the step of coating both of said first and second surfaces with solder.

37. The method of claim 26 wherein said performing step is preceded by an oxygen plasma treatment.

38. A fluxless soldering method for first and second surfaces comprising the steps of:
 a. providing a first surface having solder thereon, said solder having a surface oxide layer; and
 b. performing fluorine-containing plasma excitation on said solder;
 whereby said first surface may be soldered to a second surface without the need for post-soldering cleaning.

39. The method of claim 38 wherein said performing a fluorine-containing plasma excitation step comprises performing fluorine plasma excitation for approximately one-half to three minutes.

40. The method of claim 38 wherein said performing excitation step occurs at approximately 34°–50° C.

41. The method of claim 38 wherein said performing a plasma excitation step comprises the use of fluorine radicals as the reactive species.

42. The method of claim 38 wherein said performing a fluorine-containing plasma excitation step is performed until sufficient fluorine compound forms in said solder to permit wetting to occur.

43. The method of claim 38 wherein said performing step is preceded by an oxygen plasma treatment.

* * * * *